(12) United States Patent
Vasilache

(10) Patent No.: US 10,770,081 B2
(45) Date of Patent: Sep. 8, 2020

(54) STEREO AUDIO SIGNAL ENCODER

(71) Applicant: Nokia Technologies Oy, Espoo (FI)

(72) Inventor: Adriana Vasilache, Tampere (FI)

(73) Assignee: Nokia Technologies Oy, Espoo (FI)

(*) Notice: Subject to any disclaimer, the term of this patent is extended or adjusted under 35 U.S.C. 154(b) by 0 days.

(21) Appl. No.: 16/479,916

(22) PCT Filed: Jan. 3, 2018

(86) PCT No.: PCT/FI2018/050007
§ 371 (c)(1),
(2) Date: Jul. 22, 2019

(87) PCT Pub. No.: WO2018/142017
PCT Pub. Date: Aug. 9, 2018

(65) Prior Publication Data
US 2019/0392847 A1 Dec. 26, 2019

(30) Foreign Application Priority Data
Jan. 31, 2017 (GB) .................................. 1701596.7

(51) Int. Cl.
*G10L 19/24* (2013.01)
*G10L 19/008* (2013.01)
*G10L 19/035* (2013.01)

(52) U.S. Cl.
CPC .......... *G10L 19/008* (2013.01); *G10L 19/035* (2013.01); *G10L 19/24* (2013.01)

(58) Field of Classification Search
CPC ...... G10L 19/008; G10L 19/035; G10L 19/24
(Continued)

(56) References Cited

U.S. PATENT DOCUMENTS 9,083,374 B2 7/2015 Marpe et al.
9,373,332 B2* 6/2016 Oshikiri ................ G10L 19/008
(Continued)

FOREIGN PATENT DOCUMENTS

EP 2856776 A1 4/2015
GB 2524333 A 9/2015
(Continued)

OTHER PUBLICATIONS

Costa et al., "Efficient Run-length Encoding of Binary Sources with Unknown Statistics", Technical Report, Dec. 19, 2003, 12 pages.
(Continued)

*Primary Examiner* — Disler Paul
(74) *Attorney, Agent, or Firm* — Nokia Technologies Oy

(57) ABSTRACT

A method comprising: receiving at least two audio channel signals; determining, for a first frame, at least two parameters representing a difference between the at least two channel audio signals; scalar quantising the at least two parameters to generate at least two index values; adaptively encoding an initial scalar quantized parameter of the at least two parameters; determining whether the initial scalar quantized parameter has a value different from a predetermined value; adaptively encoding any unencoded scalar quantized parameters where the initial scalar quantized parameter has a value different from the predetermined value; determining whether all of the at least two scalar quantized parameters have values equal to the predetermined value where the initial scalar quantized parameter has a value equal to the predetermined value; adaptively encoding any unencoded scalar quantized parameters and generating an indicator that an output is one of fixed or variable rate coding where the initial scalar quantized parameter has a value equal to the predetermined value and at least one of the at least two scalar quantized parameters have values different from the
(Continued)

predetermined value; generating an indicator that the output is the other of the one of fixed or variable rate coding where the initial scalar quantized parameter has a value equal to the predetermined value and all of the at least two scalar quantized parameters have values equal to the predetermined value; generating a single channel representation of the at least two audio channel signals dependent on the at least two parameters; and encoding the single channel representation.

20 Claims, 10 Drawing Sheets

(58) Field of Classification Search
USPC .............. 381/22–23; 704/503–504, 230, 222
See application file for complete search history.

(56) References Cited

U.S. PATENT DOCUMENTS

| | | | |
|---|---|---|---|
| 10,548,227 B2* | 1/2020 | Sabavat | ............... H05K 1/0224 |
| 2005/0177360 A1 | 8/2005 | Schuijers et al. | |
| 2008/0215340 A1 | 9/2008 | Su et al. | |
| 2009/0125315 A1* | 5/2009 | Koishida | ............... G10L 19/173 |
| | | | 704/503 |
| 2010/0324708 A1 | 12/2010 | Ojanpera | |
| 2011/0116542 A1 | 5/2011 | Oger et al. | |
| 2012/0027077 A1 | 2/2012 | Reznik | |
| 2013/0226594 A1 | 8/2013 | Fuchs et al. | |
| 2015/0016537 A1 | 1/2015 | Karczewicz et al. | |
| 2015/0154968 A1 | 6/2015 | Kastner et al. | |
| 2016/0027445 A1* | 1/2016 | Vasilache | ................ H04S 1/007 |
| | | | 381/22 |
| 2016/0217800 A1 | 7/2016 | Pumhagen et al. | |

FOREIGN PATENT DOCUMENTS

| | | |
|---|---|---|
| WO | 2013/156814 A1 | 10/2013 |
| WO | 2013/179084 A1 | 12/2013 |
| WO | 2013/185857 A1 | 12/2013 |
| WO | 2014/013294 A1 | 1/2014 |
| WO | 2014/108738 A1 | 7/2014 |
| WO | 2014/147441 A1 | 9/2014 |
| WO | 2014/174344 A1 | 10/2014 |
| WO | 2014/210284 A1 | 12/2014 |
| WO | 2015/036349 A1 | 3/2015 |
| WO | 2016/185459 A1 | 11/2016 |

OTHER PUBLICATIONS

Search Report received for corresponding United Kingdom Patent Application No. 17015961, dated Sep. 4, 2017, 3 pages.
Search Report received for corresponding United Kingdom Patent Application No. 1701594.2, dated Sep. 6, 2017, 3 pages.
International Search Report and Written Opinion received for corresponding Patent Cooperation Treaty Application No. PCT/FI2018/050007, dated May 28, 2018, 16 pages.
Malvar, "Adaptive Run-Length / Golomb-Rice Encoding of Quantized Generalized Gaussian Sources with Unknown Statistics", Data Compression Conference, Mar. 28-30, 2006, 10 pages.
International Search Report and Written Opinion received for corresponding Patent Cooperation Treaty Application No. PCT/FI2018/050018, dated May 31, 2018, 17 pages.
Breebaart et al."Parametric Coding of Stereo Audio", EURASIP Journal on Advances in Signal Processing, 2005, No. 9, pp. 1305-1322.

* cited by examiner

STEREO AUDIO SIGNAL ENCODER

RELATED APPLICATION

This application was originally filed as PCT Application No. PCT/FI2018/050007 filed Jan. 3, 2018, which claims priority benefit from GB Application No. 1701596.7 filed Jan. 31, 2017.

FIELD

The present application relates to a stereo audio signal encoder, and in particular, but not exclusively to a stereo audio signal encoder for use in portable apparatus.

BACKGROUND

Audio signals, like speech or music, are encoded for example to enable efficient transmission or storage of the audio signals.

Audio encoders and decoders (also known as codecs) are used to represent audio based signals, such as music and ambient sounds (which in speech coding terms can be called background noise). These types of coders typically do not utilise a speech model for the coding process, rather they use processes for representing all types of audio signals, including speech. Speech encoders and decoders (codecs) can be considered to be audio codecs which are optimised for speech signals, and can operate at either a fixed or variable bit rate.

An audio codec can also be configured to operate with varying bit rates. At lower bit rates, such an audio codec may be optimized to work with speech signals at a coding rate equivalent to a pure speech codec. At higher bit rates, the audio codec may code any signal including music, background noise and speech, with higher quality and performance. A variable-rate audio codec can also implement an embedded scalable coding structure and bitstream, where additional bits (a specific amount of bits is often referred to as a layer) improve the coding upon lower rates, and where the bitstream of a higher rate may be truncated to obtain the bitstream of a lower rate coding. Such an audio codec may utilize a codec designed purely for speech signals as the core layer or lowest bit rate coding.

An audio codec is designed to maintain a high (perceptual) quality while improving the compression ratio. Thus instead of waveform matching coding it is common to employ various parametric schemes to lower the bit rate. For multichannel audio, such as stereo signals, it is common to use a larger amount of the available bit rate on a mono channel representation and encode the stereo or multichannel information exploiting a parametric approach which uses relatively few bits.

Current speech and audio standardization efforts at the 3rd Generation Partnership Project (3GPP) aim to increase the quality of the encoded signal through coding efficiency, bandwidth, as well as number of channels. A stereo/binaural extension is being prepared for the Enhanced Voice Services (EVS) speech and audio codec candidate. The coding efficiency for this proposal is of importance, especially for lower codec bitrates. As the addition of a large bitrate extension would diminish the benefits of having an extension, if the total bitrate equals or overpasses the bitrate of a dual mode.

The proposed stereo/binaural extension is composed of encoded stereo parameters. Increasing the coding efficiency for these parameters means reducing the bitrate of the extension and using the 'saved' bits for better encoding of the mono downmix. This is particularly useful at low bit rates where the quality of the encoded downmix is more sensitive to the bitrate.

In addressing the coding efficiency of the stereo parameters a significant saving of bits may be made. Coding efficiency of stereo parameters has involved quantization of the values (levels), followed by entropy encoding to reduce further the bitrate. A previously proposed method for encoding the stereo parameters disclosed in EP2856776 uses an adaptive version of the Golomb Rice coding.

SUMMARY

There is provided according to a first aspect a method comprising: receiving at least two audio channel signals; determining, for a first frame, at least two parameters representing a difference between the at least two channel audio signals; scalar quantising the at least two parameters to generate at least two index values; adaptively encoding an initial scalar quantized parameter of the at least two parameters; determining whether the initial scalar quantized parameter has a value different from a predetermined value; adaptively encoding any unencoded scalar quantized parameters where the initial scalar quantized parameter has a value different from the predetermined value; determining whether all of the at least two scalar quantized parameters have values equal to the predetermined value where the initial scalar quantized parameter has a value equal to the predetermined value; adaptively encoding any unencoded scalar quantized parameters and generating an indicator that an output is one of fixed or variable rate coding where the initial scalar quantized parameter has a value equal to the predetermined value and at least one of the at least two scalar quantized parameters have values different from the predetermined value; generating an indicator that the output is the other of the one of fixed or variable rate coding where the initial scalar quantized parameter has a value equal to the predetermined value and all of the at least two scalar quantized parameters have values equal to the predetermined value; generating a single channel representation of the at least two audio channel signals dependent on the at least two parameters; and encoding the single channel representation.

Adaptively encoding an initial scalar quantized parameter and adaptively encoding any unencoded scalar quantized parameters the scalar quantized parameters may comprise: determining an initial index map for reordering an index value associated with the scalar quantized parameter, and determining at least one further index map for reordering at least one further index value associated with the any unencoded scalar quantized parameters, wherein the at least one further index map is determined based on the index value associated with the scalar quantized parameter; reordering the index value associated with the scalar quantized parameter based on the initial index map; reordering the at least one further index value associated with the any unencoded scalar quantized parameters based on the at least one further index map; encoding the reordered index value associated with the scalar quantized parameter dependent on an order position of the reordered index value associated with the scalar quantized parameter; and encoding the at least one further index value associated with the any unencoded scalar quantized parameters based on an order position of the reordered at least one further index value associated with the any unencoded scalar quantized parameters.

Adaptively encoding the scalar quantized parameters may comprise: determining an occurrence frequency of index values; reordering the index value dependent on the occurrence frequency of index values to generate a reordered index value; encoding the reordered index value dependent on an order position of the reordered index value.

Encoding the reordered index value dependent on an order position of the reordered index value may comprise applying a Golomb-Rice encoding to the reordered index value dependent on an order position of the reordered index value.

Determining an occurrence frequency of index values further may comprise: receiving for a group of index values a first index value; increasing a count value associated with the first index value; and decreasing a count value associated with index values other than the first index value.

Scalar quantising the at least two parameters may further comprise ordering the scalar quantized output according to a predetermined map.

The one of fixed or variable rate coding may be the fixed rate coding and the other of fixed or variable rate coding may be variable rate coding.

Encoding the single channel representation may comprise: determining the number of bits used for encoding the at least two scalar quantized parameters; and encoding the single channel representation based on the determined number of bits.

According to a second aspect there is provided a method comprising: decoding from a first part of a signal at least one parameter index value, wherein the parameter represent a difference between at least two channel audio signals, and from a second part of the signal a fixed rate/variable rate indicator and wherein the signal is an encoded multichannel audio signal; reordering a first of the at least one parameter index value based on a first determined reordering to generate a first reordered index value; determining whether a parameter value associated with the first reordered index is different from a predetermined value; adaptively reordering any further of the at least one parameter index values where the parameter value associated with the first reordered index is different to the predetermined value; determining whether the fixed rate/variable rate indicator is a determined one of a fixed rate/variable rate value; adaptively reordering any further of the at least one parameter index value where the parameter value associated with the first reordered index is equal to the predetermined value and the fixed rate/variable rate indicator is the determined one of a fixed rate/variable rate value; and duplicating the at least one parameter index value for a frame where the parameter value associated with the first reordered index is equal to the predetermined value and the fixed rate/variable rate indicator is other than the determined one of a fixed rate/variable rate value.

Reordering a first of the at least one parameter index value based on a first determined reordering to generate a first reordered index value may comprise reordering a first parameter index value based on a first determined reordering to generate a first reordered index value, and adaptively reordering any further of the at least one parameter index values comprises reordering any further index values based on a second determined reordering to generate a second reordered index value, wherein the second determined reordering is based on the first reordered index value.

Adaptively reordering any further of the at least one parameter index values may comprise: determining an occurrence frequency of index values; and reordering the index value to generate a reordered index value, wherein the reordering is dependent on the occurrence frequency of reordered index values.

The method may further comprise dequantizing the reordered index values to generate the parameter.

Decoding from a first part of a signal may comprise decoding a first part of a signal using a Golomb-Rice decoding.

The determined one of a fixed rate/variable rate value may be a fixed rate coding indicator value.

The method may further comprise: receiving from a further part of a signal an encoded downmix channel signal; determining a number of bits used in the first part of the signal; and decoding the encoded downmix channel signal based on the number of bits used in the first part of the signal.

The predetermined value may be zero.

An apparatus may configured to perform the method of encoding described herein.

An apparatus may be configured to perform the method of decoding described herein.

According to a third aspect there is provided an apparatus comprising: a parameter determiner configured to determine, for a first frame, at least two parameters representing a difference between the at least two channel audio signals; a scalar quantiser configured to scalar quantise the at least two parameters to generate at least two index values; a parameter encoder configured to adaptively encode an initial scalar quantiser parameter of the at least two parameters; a bitstream indicator configured to generate an indicator that an output bitstream is one or other of fixed or variable rate coding; a encoder controller configured to determine whether the initial scalar quantiser parameter has a value different from a predetermined value, and configured to control the parameter encoder to adaptively encode any unencoded scalar quantized parameters where the initial scalar quantized parameter has a different from the predetermined value, and wherein the encoder controller is further configured to determine whether all of the at least two scalar quantized parameters have values equal to the predetermined value where the initial scalar quantized parameter has a value equal to the predetermined value, the encoder controller further configured to: control the parameter encoder to adaptively encode any unencoded scalar quantized parameters and control the bitstream indicator to generate the indicator that the output bitstream is one of fixed or variable rate coding where the initial scalar quantized parameter has a value equal to the predetermined value and at least one of the at least two scalar quantized parameters have values different from the predetermined value; control the bitstream indicator to generate an indicator that the output is the other of the one of fixed or variable rate coding where the initial scalar quantized parameter has a value equal to the predetermined value and all of the at least two scalar quantized parameters have values equal to the predetermined value; a mono channel generator configured to generate a single channel representation of the at least two audio channel signals dependent on the at least two parameters; and a mono channel encoder configured to encode the single channel representation.

The parameter encoder may be configured to: determine an initial index map for reordering an index value associated with the scalar quantized parameter, and determining at least one further index map for reordering at least one further index value associated with the any unencoded scalar quantized parameters, wherein the at least one further index map is determined based on the index value associated with the scalar quantized parameter; reorder the index value associated with the scalar quantized parameter based on the initial index map; reorder the at least one further index value associated with the any unencoded scalar quantized parameters based on the at least one further index map; encode the reordered index value associated with the scalar quantized parameter dependent on an order position of the reordered index value associated with the scalar quantized parameter; and encode the at least one further index value associated with the any unencoded scalar quantized parameters based on an order position of the reordered at least one further index value associated with the any unencoded scalar quantized parameters.

The parameter encoder may be configured to: determine an occurrence frequency of index values; reorder the index value dependent on the occurrence frequency of index values to generate a reordered index value; and encode the reordered index value dependent on an order position of the reordered index value.

The parameter encoder may be configured to apply a Golomb-Rice encoding to the reordered index value dependent on an order position of the reordered index value.

The parameter encoder may be configured to: receive for a group of index values a first index value; increase a count value associated with the first index value; and decrease a count value associated with index values other than the first index value, so to maintain a running count of index values.

The scalar quantiser may be configured to order the scalar quantized output according to a predetermined map.

The one of the fixed or variable rate coding may be the fixed rate coding and the other of fixed or variable rate coding may be variable rate coding.

The mono channel encoder may be configured to: determine the number of bits used for encoding the at least two scalar quantized parameters; and encode the single channel representation based on the determined number of bits.

According to a fourth aspect there is provided an apparatus for decoding comprising: a parameter decoder configured to decode from a first part of a signal at least one parameter index value, wherein the parameter represent a difference between at least two channel audio signals, and wherein the signal is an encoded multichannel audio signal; an indicator decoder configured to decode from a second part of the signal a fixed rate/variable rate indicator; a parameter reorderer configured to reorder a first of the at least one parameter index value based on a first determined reordering to generate a first reordered index value; a parameter determiner configured to determine whether a parameter value associated with the first reordered index is different from a predetermined value; the parameter determiner is further configured to adaptively reordering any further of the at least one parameter index values where the parameter value associated with the first reordered index is different to the predetermined value; the parameter determiner further configured to determine whether the fixed rate/variable rate indicator is a determined one of a fixed rate/variable rate value; the parameter reorderer configured to adaptively reorder any further of the at least one parameter index value where the parameter value associated with the first reordered index is equal to the predetermined value and the fixed rate/variable rate indicator is the determined one of a fixed rate/variable rate value, and duplicate the at least one parameter index value for a frame where the parameter value associated with the first reordered index is equal to the predetermined value and the fixed rate/variable rate indicator is other than the determined one of a fixed rate/variable rate value.

The parameter reorderer may be configured to reorder a first parameter index value based on a first determined reordering to generate a first reordered index value, and reorder any further index values based on a second determined reordering to generate a second reordered index value, wherein the second determined reordering may be based on the first reordered index value.

The parameter reorderer configured to adaptively reorder any further of the at least one parameter index values may be configured to: determine an occurrence frequency of index values; reorder the index value to generate a reordered index value, wherein the reordering is dependent on the occurrence frequency of reordered index values.

The parameter reorderer may be further configured to dequantize the reordered index values to generate the parameter.

The parameter decoder may be configured to decode the first part of a signal using a Golomb-Rice decoding.

The determined one of a fixed rate/variable rate value may be a fixed rate coding indicator value.

The apparatus may further comprise a further decoder configured to: receive from a further part of a signal an encoded downmix channel signal; determine a number of bits used in the first part of the signal; decode the encoded downmix channel signal based on the number of bits used in the first part of the signal.

The predetermined value may be zero.

The parameters representing a difference between the at least two channel audio signals may be at least one of: a side gain, an interchannel phase difference, a residual prediction gain.

A computer program product may cause an apparatus to perform the method as described herein.

An electronic device may comprise apparatus as described herein.

A chipset may comprise apparatus as described herein.

BRIEF DESCRIPTION OF DRAWINGS

For better understanding of the present invention, reference will now be made by way of example to the accompanying drawings in which.

DESCRIPTION OF SOME EMBODIMENTS OF THE APPLICATION

The following describes in more detail possible stereo and multichannel speech and audio codecs, including layered or scalable variable rate speech and audio codecs. As discussed above a previously proposed method for encoding the stereo parameters disclosed in EP2856776 uses an adaptive version of Golomb Rice coding.

A previously proposed method for adaptive encoding the stereo parameter for some types of stereo parameters. For example parameters, such as residual prediction gain parameters, may for a whole frame have values which are zero or when quantized are zero. This type of parameter can upset the adaptive coding occurrence (or frequency) counts and thus produce inefficient coding for some frames after an all zero frame until the average condition is reached again.

This for example can be visualised where looking at quantized indexes of 'residual prediction gains' several frames where the indices are zero in all subbands are observed. Where the number of these zero value frames is big enough it can influence the statistics of the quantized index values, making the value '0' more probable. For example it may be a situation where using all frames the statistics determine that the zero value is 4th out of 8 symbols. If the frames where all indexes are zero are taken out (for the cases when the residual prediction gains are transmitted), the probability of the symbol '0' may be the least frequent (the 8th, out of 8 symbols). This may translate in reduced coding efficiency and coding efficiency of the last 5 most statistically probable symbols being reduced.

The concept as expressed in the embodiments described hereafter is one which attempts to better control the application of the adaptive encoding method, such as featured in EP2856776.

In some embodiments this control may be implemented in a system wherein any frames with all zero parameter values are explicitly indicated or signalled.

However in some embodiments and as described in further detail later in some embodiments a fixed rate coding mode may be exploited to implicitly signal the information.

Figure 1:
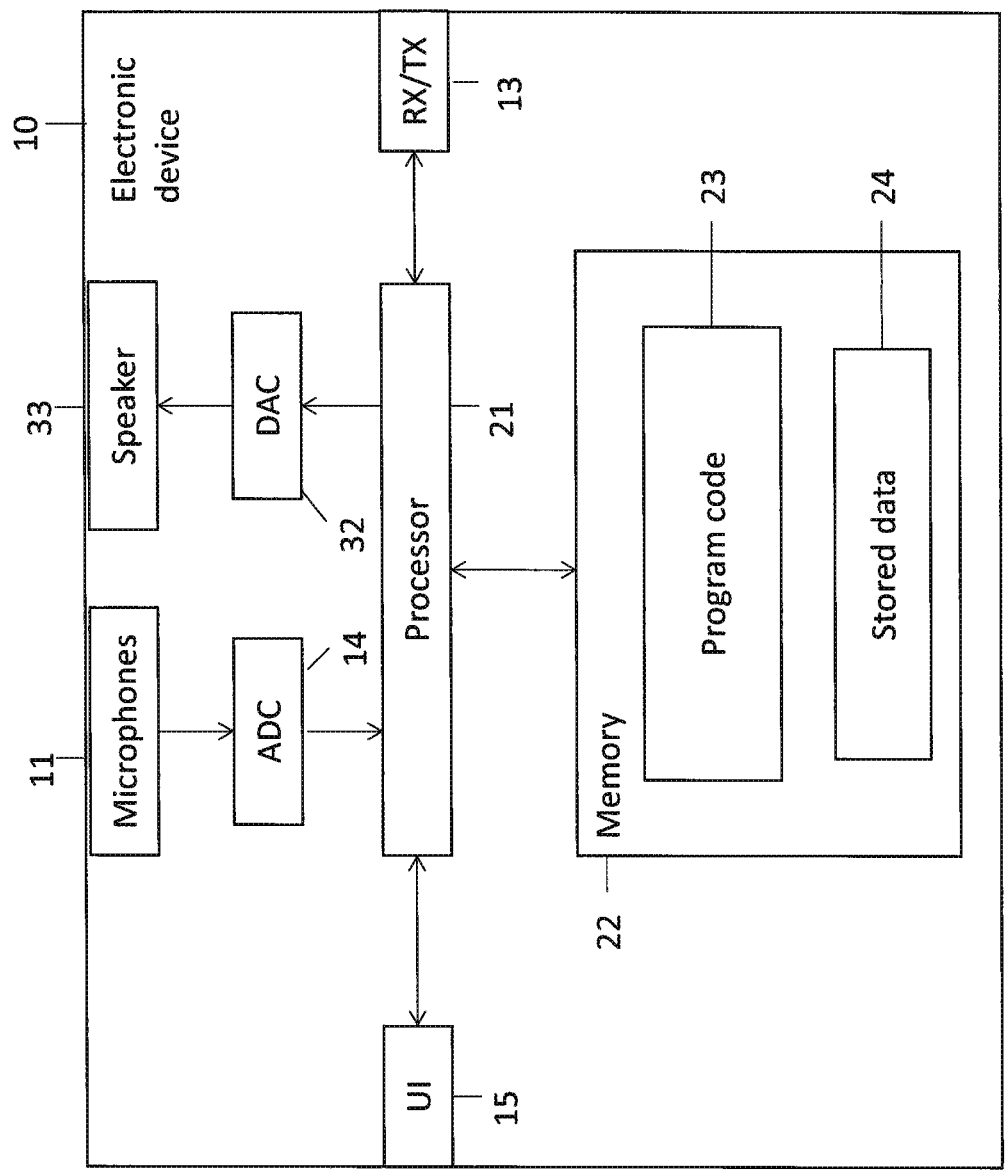
FIG. 1 shows schematically an electronic device employing some embodiments.

In this regard reference is first made to FIG. 1 which shows a schematic block diagram of an exemplary electronic device or apparatus 10, which may incorporate a codec according to an embodiment of the application.

The apparatus 10 may for example be a mobile terminal or user equipment of a wireless communication system. In other embodiments the apparatus 10 may be an audio-video device such as video camera, a Television (TV) receiver, audio recorder or audio player such as a mp3 recorder/player, a media recorder (also known as a mp4 recorder/player), or any computer suitable for the processing of audio signals.

The electronic device or apparatus 10 in some embodiments comprises a microphone 11, which is linked via an analogue-to-digital converter (ADC) 14 to a processor 21. The processor 21 is further linked via a digital-to-analogue (DAC) converter 32 to loudspeakers 33. The processor 21 is further linked to a transceiver (RX/TX) 13, to a user interface (UI) 15 and to a memory 22.

The processor 21 can in some embodiments be configured to execute various program codes. The implemented program codes in some embodiments comprise a multichannel or stereo encoding or decoding code as described herein. The implemented program codes 23 can in some embodiments be stored for example in the memory 22 for retrieval by the processor 21 whenever needed. The memory 22 could further provide a section 24 for storing data, for example data that has been encoded in accordance with the application.

The encoding and decoding code in embodiments can be implemented in hardware and/or firmware.

The user interface 15 enables a user to input commands to the electronic device 10, for example via a keypad, and/or to obtain information from the electronic device 10, for example via a display. In some embodiments a touch screen may provide both input and output functions for the user interface. The apparatus 10 in some embodiments comprises a transceiver 13 suitable for enabling communication with other apparatus, for example via a wireless communication network.

It is to be understood again that the structure of the apparatus 10 could be supplemented and varied in many ways.

A user of the apparatus 10 for example can use the microphone 11 for inputting speech or other audio signals that are to be transmitted to some other apparatus or that are to be stored in the data section 24 of the memory 22. A corresponding application in some embodiments can be activated to this end by the user via the user interface 15. This application in these embodiments can be performed by the processor 21, causes the processor 21 to execute the encoding code stored in the memory 22.

The analogue-to-digital converter (ADC) 14 in some embodiments converts the input analogue audio signal into a digital audio signal and provides the digital audio signal to the processor 21. In some embodiments the microphone 11 can comprise an integrated microphone and ADC function and provide digital audio signals directly to the processor for processing.

Figure 8:
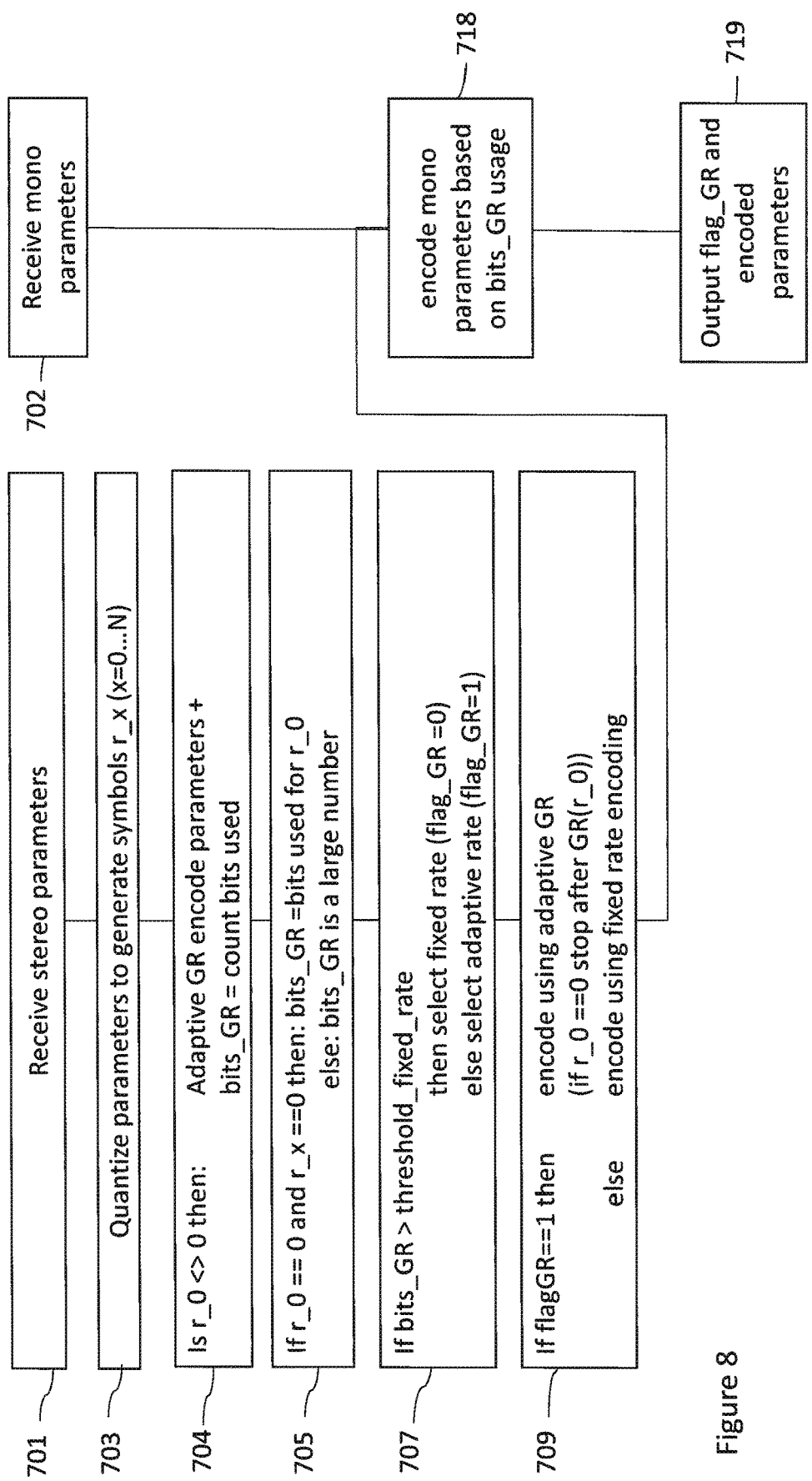
FIG. 8 shows a flow diagram illustrating the operation of the channel encoder as shown in FIG. 5 according to some embodiments.
Figure 9:
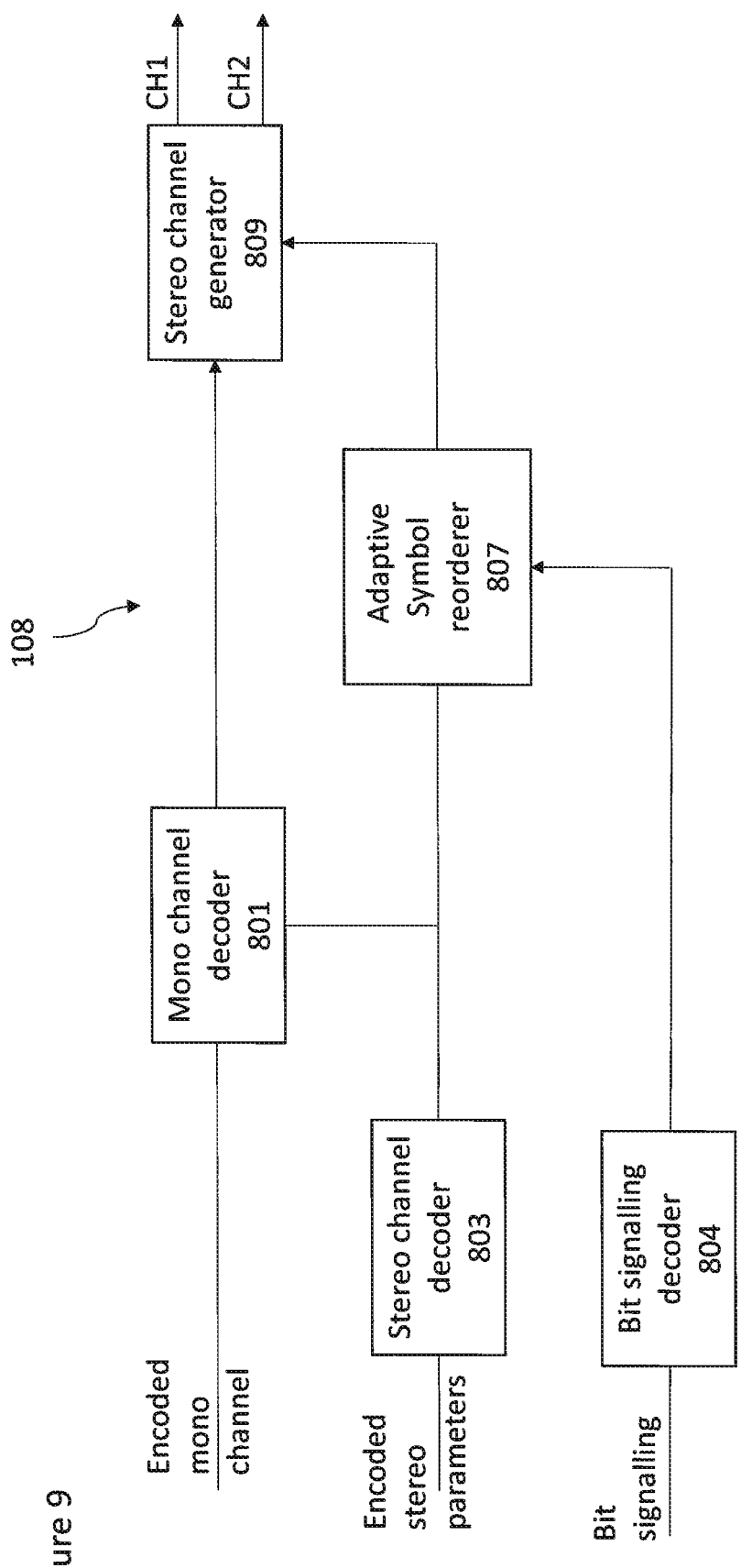
FIG. 9 shows schematically the decoder as shown in FIG. 2 according to some embodiments.
Figure 10:
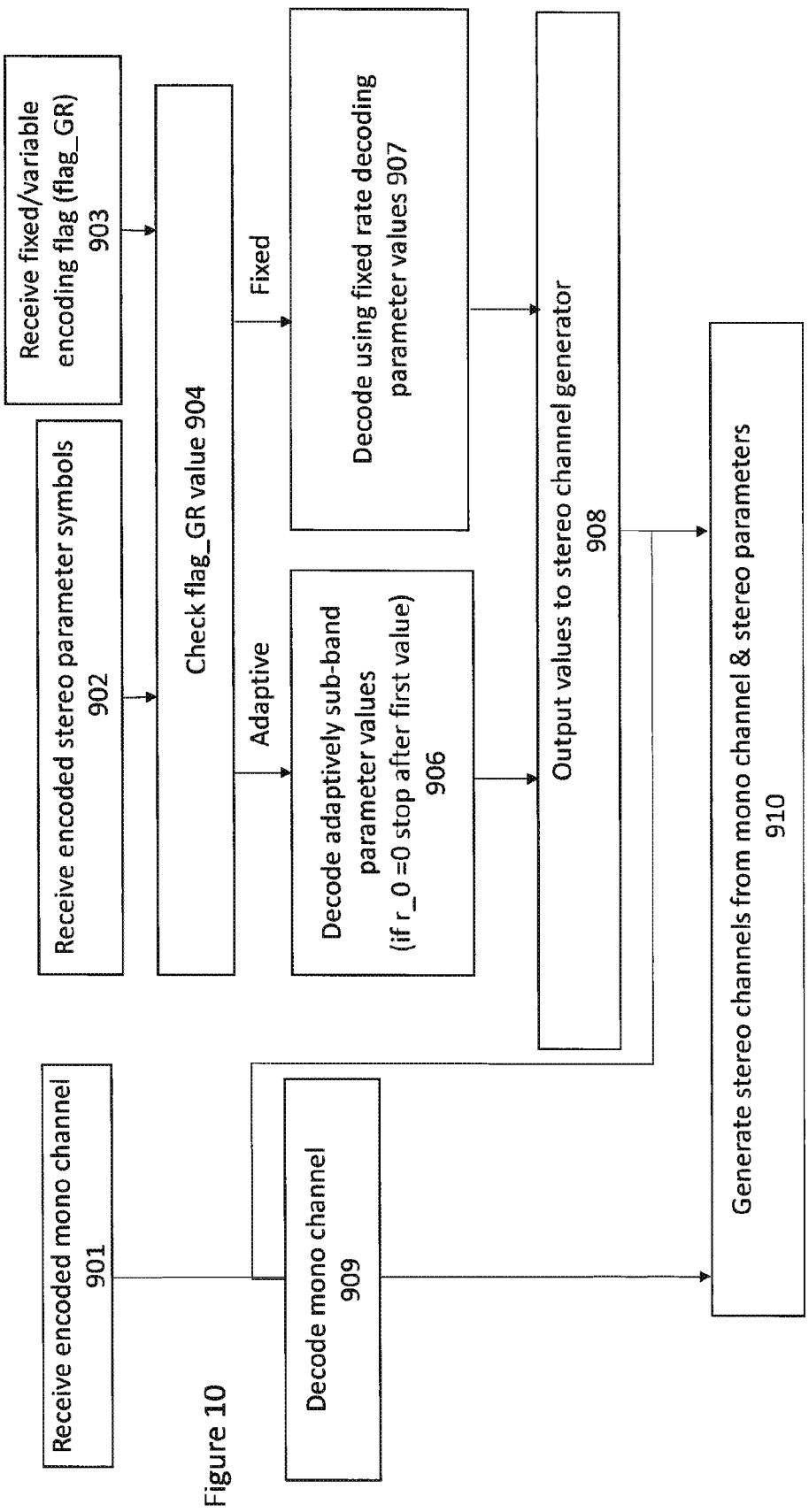
FIG. 10 shows a flow diagram illustrating the operation of the decoder as shown in FIG. 9 according to some embodiments.

The processor 21 in such embodiments then processes the digital audio signal in the same way as described with reference to the system shown in FIG. 2, the encoder shown in FIGS. 2 to 8 and the decoder as shown in FIGS. 9 and 10.

The resulting bit stream can in some embodiments be provided to the transceiver 13 for transmission to another apparatus. Alternatively, the coded audio data in some embodiments can be stored in the data section 24 of the memory 22, for instance for a later transmission or for a later presentation by the same apparatus 10.

The apparatus 10 in some embodiments can also receive a bit stream with correspondingly encoded data from another apparatus via the transceiver 13. In this example, the processor 21 may execute the decoding program code stored in the memory 22. The processor 21 in such embodiments decodes the received data, and provides the decoded data to a digital-to-analogue converter 32. The digital-to-analogue converter 32 converts the digital decoded data into analogue audio data and can in some embodiments output the analogue audio via the loudspeakers 33. Execution of the decoding program code in some embodiments can be triggered as well by an application called by the user via the user interface 15.

The received encoded data in some embodiment can also be stored instead of an immediate presentation via the loudspeakers 33 in the data section 24 of the memory 22, for instance for later decoding and presentation or decoding and forwarding to still another apparatus.

It would be appreciated that the schematic structures described in FIGS. 3, 5, 7 and 9, and the method steps shown in FIGS. 4, 6, 8 and 10 represent only a part of the operation of an audio codec and specifically part of a stereo encoder/decoder apparatus or method as exemplarily shown implemented in the apparatus shown in FIG. 1.

Figure 2:
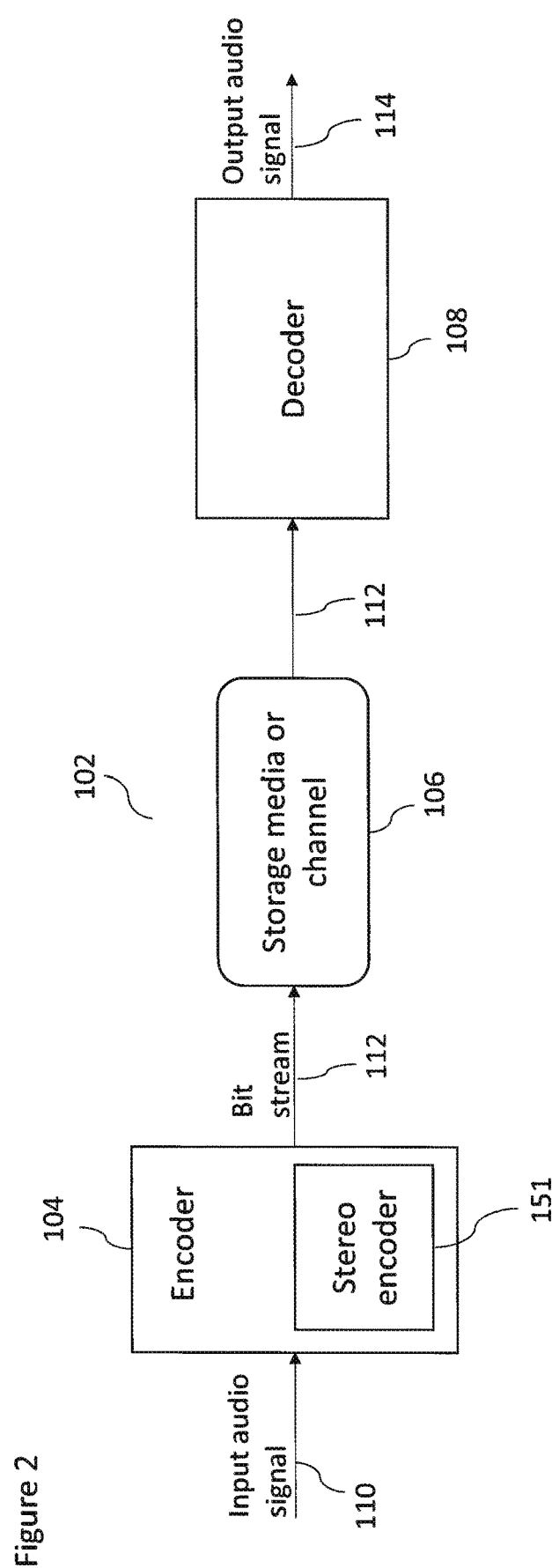
FIG. 2 shows schematically an audio codec system according to some embodiments.

The general operation of audio codecs as employed by embodiments is shown in FIG. 2. General audio coding/decoding systems comprise both an encoder and a decoder, as illustrated schematically in FIG. 2. However, it would be understood that some embodiments can implement one of either the encoder or decoder, or both the encoder and decoder. Illustrated by FIG. 2 is a system 102 with an encoder 104 and in particular a stereo encoder 151, a storage or media channel 106 and a decoder 108. It would be understood that as described above some embodiments can comprise or implement one of the encoder 104 or decoder 108 or both the encoder 104 and decoder 108.

The encoder 104 compresses an input audio signal 110 producing a bit stream 112, which in some embodiments can be stored or transmitted through a media channel 106. The encoder 104 furthermore can comprise a stereo encoder 151 as part of the overall encoding operation. It is to be understood that the stereo encoder may be part of the overall encoder 104 or a separate encoding module. The encoder 104 can also comprise a multi-channel encoder that encodes more than two audio signals.

The bit stream 112 can be received within the decoder 108. The decoder 108 decompresses the bit stream 112 and produces an output audio signal 114. The decoder 108 can comprise a stereo decoder as part of the overall decoding operation. It is to be understood that the stereo decoder may be part of the overall decoder 108 or a separate decoding module. The decoder 108 can also comprise a multi-channel decoder that decodes more than two audio signals. The bit rate of the bit stream 112 and the quality of the output audio signal 114 in relation to the input signal 110 are the main features which define the performance of the coding system 102.

Figure 3:
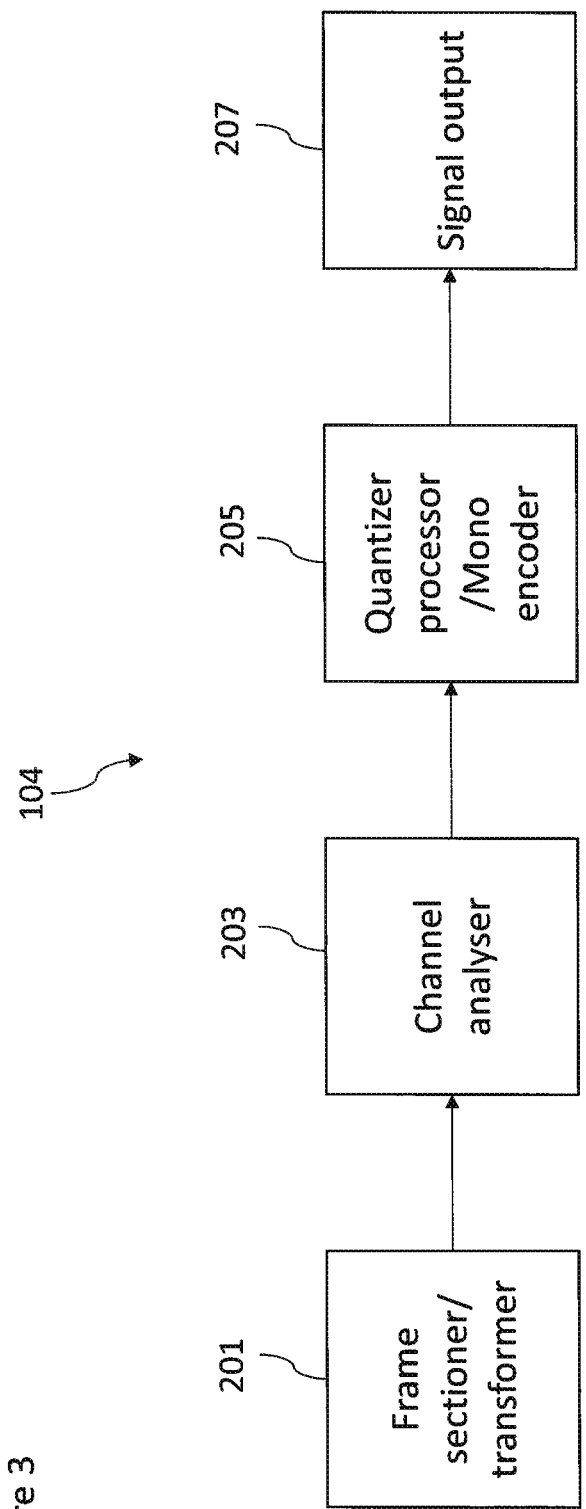
FIG. 3 shows schematically an encoder as shown in FIG. 2 according to some embodiments.

With respect to FIG. 3 an example encoder 104 is shown according to some embodiments.

The encoder 104 in some embodiments comprises a frame sectioner/transformer 201. The frame sectioner/transformer 201 is configured to receive the left and right (or more generally any multichannel audio representation) input audio signals and generate frequency domain representations of these audio signals to be analysed and encoded. These frequency domain representations can be passed to the channel parameter determiner 203.

In some embodiments the frame sectioner/transformer 201 can be configured to section or segment the audio signal data into sections or frames suitable for frequency domain transformation. The frame sectioner/transformer 201 in some embodiments can further be configured to window these frames or sections of audio signal data according to any suitable windowing function. For example the frame sectioner/transformer 201 can be configured to generate frames of 20 ms which overlap preceding and succeeding frames by 10 ms each.

In some embodiments the frame sectioner/transformer 201 can be configured to perform any suitable time to frequency domain transformation on the audio signal data. For example the time to frequency domain transformation can be a discrete Fourier transform (DFT), Fast Fourier transform (FFT), modified discrete cosine transform (MDCT). In the following examples a Fast Fourier Transform (FFT) is used. Furthermore the output of the time to frequency domain transformer can be further processed to generate separate frequency band domain representations (sub-band representations) of each input channel audio signal data. These bands can be arranged in any suitable manner. For example these bands can be linearly spaced, or be perceptual or psychoacoustically allocated. In some embodiments the frequency domain representations are passed to a channel analyser/encoder 203.

In some embodiments the encoder 104 can comprise a channel analyser 203. The channel analyser 203 can be configured to receive the sub-band filtered representations of the multichannel or stereo input. The channel analyser 203 can furthermore in some embodiments be configured to analyse the frequency domain audio signals and determine parameters associated with each sub-band with respect to the stereo or multichannel audio signal differences. Furthermore the channel analyser 203 can use these parameters and generate a mono channel which can be encoded according to any suitable encoding.

The stereo parameters and the mono parameters/signal can then be output to a quantizer processor/mono encoder 205.

In some embodiments the encoder 104 comprises a quantizer processor/mono encoder 205. The quantizer processor/mono encoder 205 can be configured to receive the stereo (difference) parameters determined by the channel analyser 203. The quantizer processor/mono encoder 205 can then in some embodiments be configured to perform a quantization on the parameters and furthermore encode the parameters so that they can be output (either to be stored on the apparatus or passed to a further apparatus). The quantizer processor/mono encoder 205 may furthermore be configured to receive the mono parameters/channel and furthermore encode the mono parameters/channel using any suitable encoding and furthermore based on the number of bits used to encode the stereo parameters. In other words the stereo parameters are first encoded and then the downmixed signal is encoded. The bits that are saved by using entropy encoding for the stereo parameters may be used to encode the downmixed signal.

In some embodiments the encoder comprises a signal output 207. The signal output as shown in FIG. 3 represents an output configured to pass the encoded stereo parameters to be stored or transmitted to a further apparatus.

Figure 4:
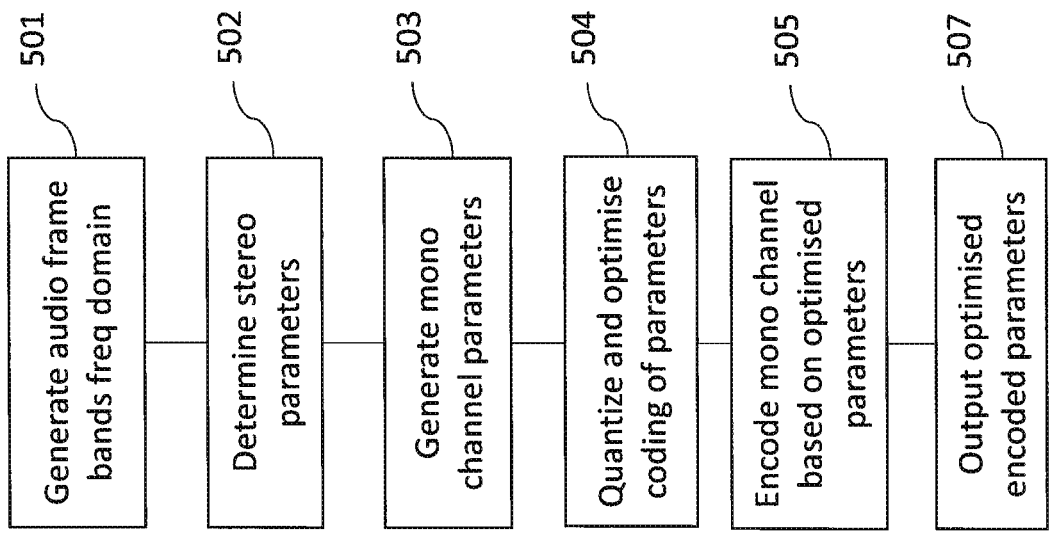
FIG. 4 shows schematically a channel analyser as shown in FIG. 3 in further detail according to some embodiments.

With respect to FIG. 4 a summary of the encoding process according to some embodiments and the operation of the encoder 104 shown in FIG. 3 is shown as a flow diagram.

The operation of generating audio frame band frequency domain representations is shown in FIG. 4 by step 501.

The operation of determining the stereo parameters is shown in FIG. 4 by step 502.

The operation of generating the mono (downmix) channel parameters is shown in FIG. 4 by step 503.

The operation of quantizing the stereo (multichannel) parameters and encoding the quantized stereo (multichannel) parameters is shown in FIG. 4 by step 504.

The operation of encoding the mono (downmix) channel parameters based on the bit usage of the optimised quantized stereo parameters is shown in FIG. 4 by step 505.

The outputting of the encoded quantized stereo (multichannel) parameters and encoded mono (downmix) parameters/signal is shown in FIG. 4 by step 507.

Figure 5:
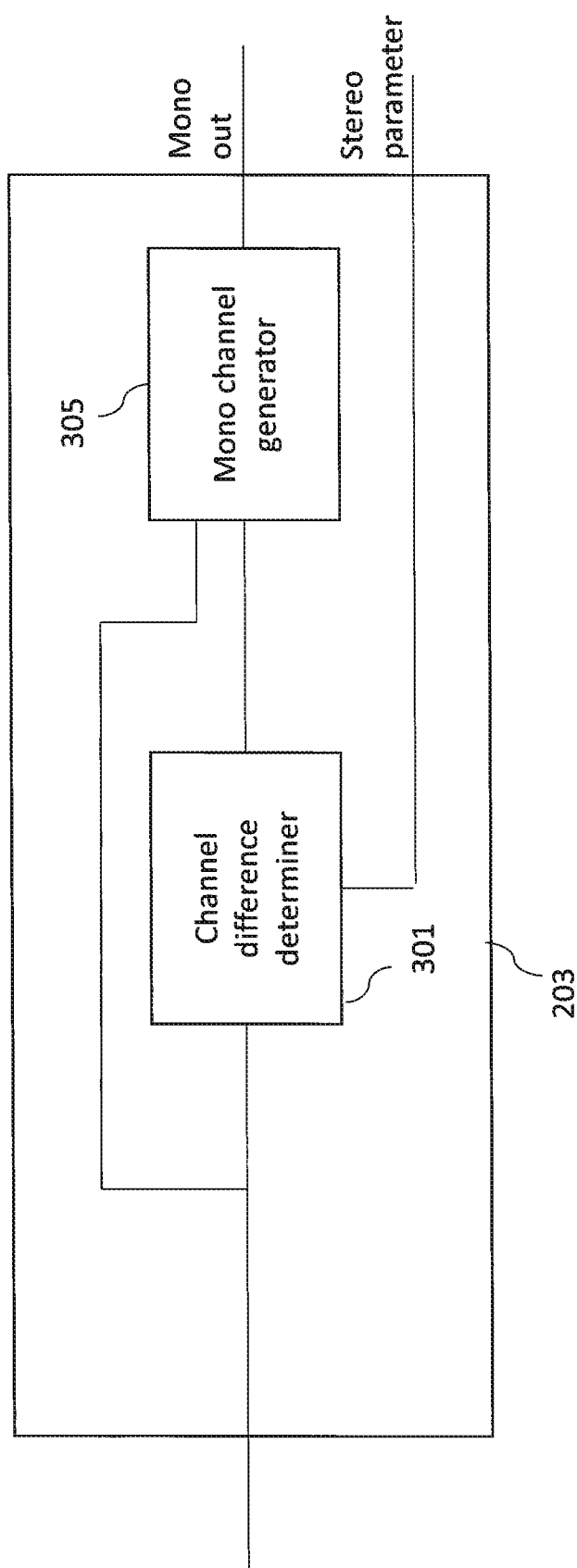
FIG. 5 shows schematically a stereo channel encoder as shown in FIG. 3 in further detail according to some embodiments.

With respect to FIG. 5 an example channel analyser 203 according to some embodiments is described in further detail.

In some embodiments the channel analyser 203 comprises a channel difference parameter determiner 301. The channel difference parameter determiner 301 is configured to determine the various channel difference parameters. In the following examples the input audio signals are left and right audio signals. In some embodiments this may be generalised as j'th and j+1'th audio channels from an multichannel audio system.

For example the channel difference parameter determiner 301 may be configured to receive the following parameters from the frame sectioner/transformer 201, $DFT_i^R$—component i of the DFT of the right channel,
$DFT_i^L$—component i of the DFT of the left channel.

These may furthermore be represented as real and imaginary parts such as for the right channel and $Re\{DFT_i^R\}$—real part of the i-th component of the DFT of the right channel,
$Im\{DFT_i^R\}$—imaginary part of the i-th component of the DFT of the right channel.

From these components the channel difference determiner may be configured to generate channel energy parameters, for example:

$EN^R = \Sigma_i (Re\{DFT_i^R\})^2 + (Im\{DFT_i^R\})^2$—energy of the right channel,
$EN_b^R = \Sigma_i (Re\{DFT_i^R\})^2 + (Im\{DFT_i^R\})^2$—energy of sub-band b of the right channel,
$EN^L = \Sigma_i (Re\{DFT_i^L\})^2 + (Im\{DFT_i^L\})^2$—energy of the left channel,
$EN_b^L = \Sigma_i (Re\{DFT_i^L\})^2 + (Im\{DFT_i^L\})^2$—energy of sub-band b of left channel,
$EN^{LR} = \Sigma_i \sqrt{EN^R EN^L}$—geometric mean of the left and right energies,
$DP_{re} = \Sigma_i Re\{DFT_i^L\} Re\{DFT_i^R\} + Im\{DFT_i^L\} Im\{DFT_i^R\}$—dot product real,
$DP_{im} = \Sigma_i Im\{DFT_i^L\} Im\{DFT_i^R\} + Re\{DFT_i^L\} Re\{DFT_i^R\}$—dot product imaginary,
$ABS_{LR} = \sqrt{DP_{re} DP_{re} + DP_{img} DP_{img}}$.

Furthermore the channel difference determiner may be configured to determine difference (stereo) parameters according to the following equations:

$$SG_b = \frac{EN_b^L - EN_b^R}{EN_b^L + EN_b^R + 2AB\,S_{LR}}$$ - side gain for sub-band $b$ $nRP\,G_b =$ $\max(0, (1-SG_b)^2\,EN_L + (1+SG_b)^2 EN_R - 2(1-SG_b^2) ABS_{LR}$ - non-normalized residual prediction gain for sub-band $b$ $$RPG_b = \sqrt{\frac{nRP\,G_b}{EN_L + EN_L + 2AB\,S_{LR}}}$$ - residual prediction gain (normalized with *downmix* energy).

Furthermore in some embodiments the channel difference determiner may be configured to generate for non-speech signals further parameters such as:

$RPG_b = 0$

For speech signals and for the higher sub-bands the channel difference determiner may be configured to generate:

$$SG_b = \frac{\sqrt{EN_L/EN_R} - 1}{\sqrt{EN_L/EN_R} + 1}$$

$IPD_b = \tan^{-1}(DP_{img}/DP_{re})$ - inter channel phase difference for sub-band $b$ (for higher sub-bands this value may be set to 0).

The difference parameters such as the interchannel phase difference, the side gain and the residual prediction gain parameter values can be passed to the mono channel generator and as stereo channel parameters to the quantizer processor.

In some embodiments the encoder 104 (or as shown in FIG. 5, the channel analyser 203) comprises a mono channel generator 305. The mono channel generator is configured to receive the channel analyser values such as the side gains and inter channel phase differences from the channel difference determiner 301. In some embodiments where the channel analyser comprises a mid/side channel converter the mono channel generator may receive the mid channel signal and this is then encoded as the mono or downmix channel. Furthermore in some embodiments the mono channel generator 305 can be configured to further receive the input multichannel audio signals. The mono channel generator 305 can in some embodiments be configured to generate an 'aligned' or downmixed channel which is representative of the audio signals. In other words the mono channel generator 305 can generate a mono (or downmixed) channel signal which represents an aligned multichannel audio signal. For example in some embodiments where there is a left channel audio signal and a right channel audio signal one of the left or right channel audio signals are delayed with respect to the other according to a determined delay difference and then the delayed channel and other channel audio signals are averaged to generate a mono channel signal. However it would be understood that in some embodiments any suitable mono channel generating method can be implemented.

The encoded mono channel parameters/signal can then be output. In some embodiments the mono channel signal is output to the quantizer processor/mono encoder 205 to be encoded.

Figure 6:
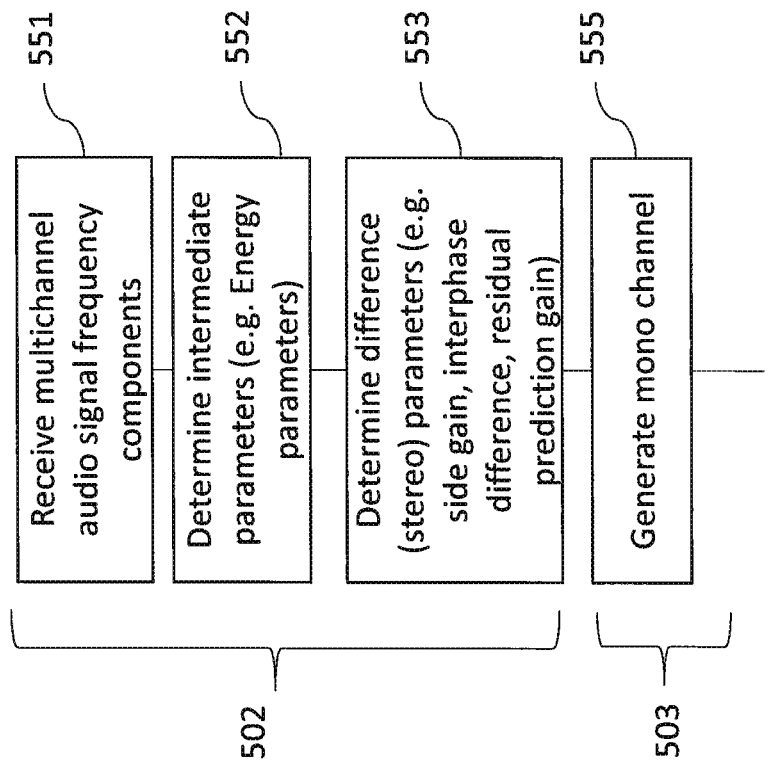
FIG. 6 shows a flow diagram illustrating the operation of the encoder shown in FIG. 2 according to some embodiments.

With respect to FIG. 6 a summary of the analysis process (such as described in FIG. 4 by steps 502 and 503) according to some embodiments and the operation of the channel analyser/encoder 203 shown in FIG. 5 is shown as a flow diagram.

The operation of receiving the multichannel audio signal frequency components is shown in FIG. 6 by step 551.

The operation of determining intermediate parameters (e.g. Energy parameters for the audio signal channels) is shown in FIG. 6 by step 552.

The operation of determining the difference parameters (e.g. side gain, interchannel phase difference, residual prediction gain) which are generated at least partially from the intermediate parameters is shown in FIG. 6 by step 553.

The operation of generating a mono (downmix) channel signal/parameters from a stereo (multichannel) signal is shown in FIG. 6 by step 555.

Figure 7:
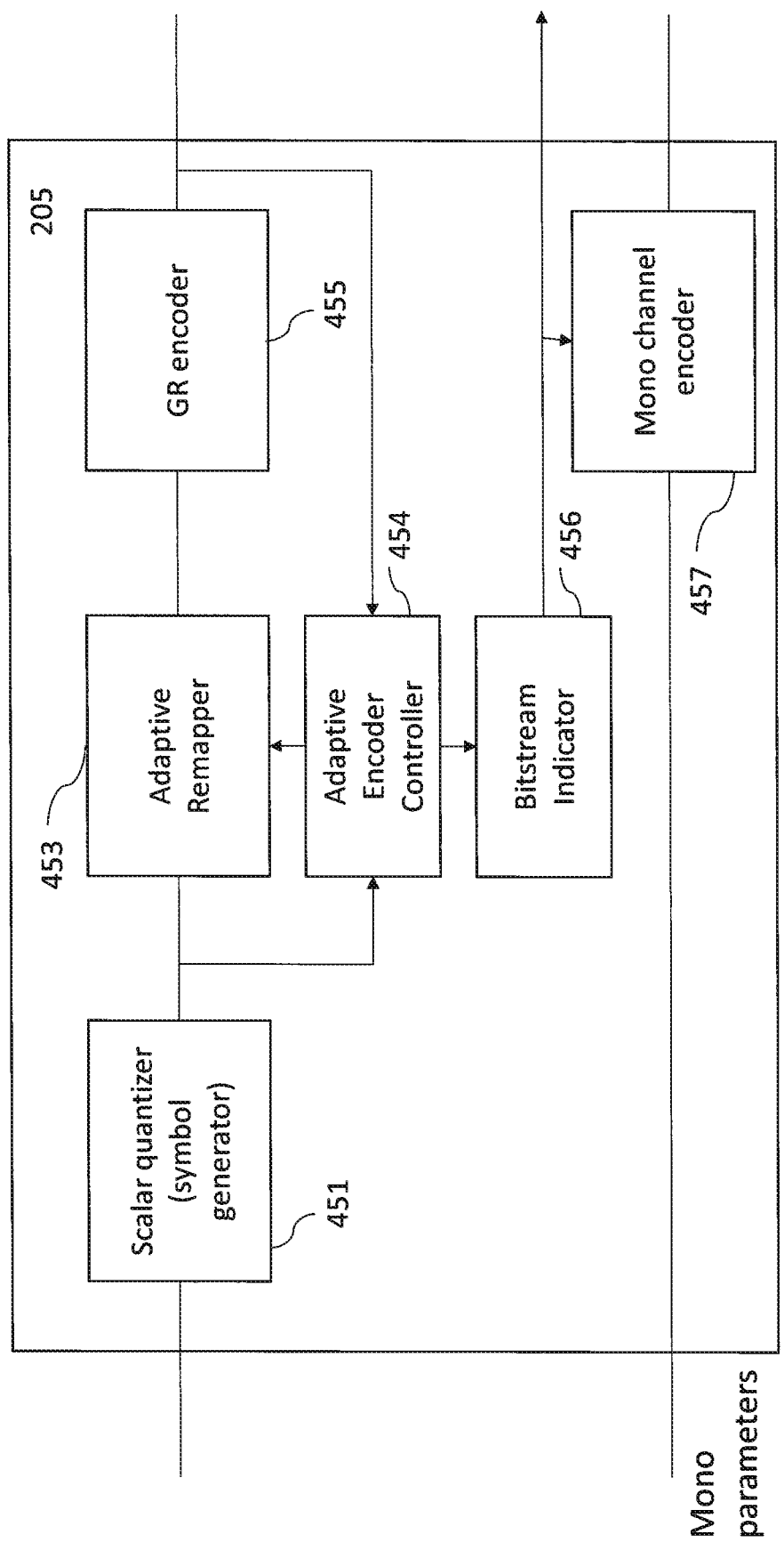
FIG. 7 shows a flow diagram illustrating the operation of the channel analyser as shown in FIG. 4 according to some embodiments.

With respect to FIG. 7 an example quantizer processor/mono encoder 205 is shown in further detail.

In some embodiments the quantizer processor 205 comprises a scalar quantizer 451. The scalar quantizer 451 is configured to receive the stereo parameters from the channel analyser 203.

The scalar quantizer can be configured to perform a scalar quantization on these values. For example the scalar quantizer 451 can be configured to quantize the values with quantisation partition regions defined by the following array.

$Q = \{-10000.0, -8.0, -3.0, -1.0, 1.0, 3.0, 5.0, 8.0, 100000.0\}$

The scalar quantizer 451 can thus output an index value symbol associated with the region within the quantization partition region the level difference value occurs within. For example an initial quantisation index value output can be as follows:

| Input difference range | −100000.0 −8.0 | −8.0 −3.0 | −3.0 −1.0 | −1.0 1.0 | 1.0 3.0 | 3.0 5.0 | 5.0 8.0 | 8.0 100000 |
|---|---|---|---|---|---|---|---|---|
| Output index | 0 | 1 | 2 | 3 | 4 | 5 | 6 | 7 |

The index values can in some embodiments be output to a remapper 453.

In some embodiments the quantizer processor/mono encoder 205 comprises an adaptive remapper 453. The adaptive remapper 453 can in some embodiments be the remapper from EP2856776 and be configured to receive the output of the scalar quantizer 451, in other words an index value associated with the quantization partition region within which the stereo or difference parameter is found and then the map the index value according to a defined mapping.

In some embodiments the index (re)mapping or reordering is based on an adaptive map selected from a range of defined maps. The defined maps may be maps which are determined from training data or any other suitable manner which exploit intraframe correlation. For example these maps may exploit the correlation between adjacent symbols representing adjacent sub-band parameters. In some embodiments the remapping or reordering of the index values may be determined based on a statistical analysis of previous parameter values.

As such in some embodiments the first symbol within a frame may be mapped according to a default or defined map. The second symbol within a frame mapped according to a map which is selected based on the first symbol, and so on.

For example a first symbol may be remapped according to a table A, the next (second) symbol may then be remapped based on a map which depends on the previous (first) symbol. For example the reordering or remapping of the second symbol may be defined as:
where previous (first) symbol=0 use table B;
where previous (first) symbol=1 use table C;
where previous (first) symbol=2 use table D;
where previous (first) symbol=3 use table E;
where previous (first) symbol=4 use table F;
where previous (first) symbol=5 use table G;
where previous (first) symbol=6 use table H; and
where previous (first) symbol=7 use table I.

These mappings may be stored as an array of mappings, such as for example
short maps[ ]={B; C; D; E; F; G; H; I};

Where if the previous symbol has been '0' then the first entry/line from the above array is used as map, if the previous symbol has been '1' then the second entry/line and so on.

In the above example the array of reordering or remapping functions is the same for each symbol. In some embodiments each symbol may have a separate array of reordering or remapping functions. For example
the second symbol may have an array
short mapsSymbol2[ ]={ . . . };
the third symbol may have an array
short mapsSymbol3[ ]={ . . . };
and so on to the eighth symbol array
short mapsSymbol8[ ]={ . . . };
where each array may be different.

This may provide the ability to tune the coding efficiency with respect to the specific sub-band to sub-band correlations at the cost of requiring additional arrays to be stored at the encoder and decoder.

Furthermore in some embodiments the array may be defined or selected from more than first order relationships. For example the array mapping function may be determined based on more than one previously determined symbol (sub-band) within the frame. This may also provide the ability to tune the coding efficiency at the cost of requiring additional arrays to be stored at the encoder and decoder.

Furthermore in some embodiments the array mapping function may be determined based on a time previous symbol. For example the mapping function may exploit any frame to frame correlation. The implementation of time and sub-band based adaptive mapping causes the table ROM to significantly increase. For 8 symbols the table with the mapping will have 64 lines instead of 8 lines. In some embodiments and depending on the data only interframe could be used instead of the intraframe. In some examples the interframe correlation is exploited by applying GR coding to the difference between the current and previous frame. The numbers 0, 1, −1, 2, −2, . . . are mapped to 0, 1, 2, 3, 4 . . . and encoded then with GR of order 0 or 1, whichever is best.

The output of the adaptive remapper 453, is then output to the Golomb-Rice encoder 455.

The quantizer processor/mono encoder 205 can in some embodiments comprise a Golomb-Rice encoder 455. The Golomb-Rice encoder (GR encoder) 455 is configured to receive the remapped index values or symbols generated by the adaptive remapper 453 and encode the index values according to the Golomb-rice encoding method. The Golomb-Rice encoder 455 in such embodiments therefore outputs a codeword representing the current and previous index values. The Golomb-Rice encoder 455 is an example of an entropy encoder and in some embodiments any other suitable entropy encoder may be implemented.

An example of a Golomb-Rice integer code for the first symbol is one where the output is as follows.

| Quantized Parameter Symbol | Mapped Parameter Symbol | GR code 0 | GR code 1 |
|---|---|---|---|
| 0 | 6 | 1111110 | 11100 |
| 1 | 3 | 1110 | 101 |
| 2 | 1 | 10 | 01 |
| 3 | 0 | 0 | 00 |
| 4 | 2 | 110 | 100 |
| 5 | 4 | 11110 | 1100 |
| 6 | 5 | 1111110 | 1101 |
| 7 | 7 | 11111110 | 11101 |

The GR encoder 455 can then output the stereo codewords. In some embodiments the codewords are passed to a multiplexer to be mixed with the encoded mono channel audio signal. However in some embodiments the stereo codewords can in some embodiments be passed to be stored or passed to further apparatus as a separate stream.

The encoding method may be used for the DFT parameters within a parametric stereo audio encoder. In some embodiments the parameters to be encoded are side gains, residual prediction gains and interchannel phase differences.

In some embodiments the quantizer processor/mono encoder 205 further comprises a (remapper or reorderer)

controller 454. The controller 454 may in some embodiments be configured to receive the output from the scalar quantizer (symbol generator) 451. The controller 454 may be configured to determine whether all of the symbols within a frame have an index which indicates the quantized value of the parameters are all zero. The controller may then, based on the determination, be configured to control the adaptive remapper 453 to operate in an adaptive mode (and/or in a statistical occurrence count or frequency count mode). Thus for example where the controller determines that all of the quantized parameter values are zero for a frame then adaptive remapping is disabled.

Furthermore in some embodiments the controller 454 is configured to control a bitstream indicator (generator).

In some embodiments the quantizer processor/mono encoder 205 comprises a bitstream indicator generator 456. The bitstream indicator generator 456 may be configured to generate bit indicators to indicate whether all of the quantized parameter values are zero for a frame and thus enable an indicator to be sent to the decoder to similarly disable the use of adaptive remapping or reordering based on the indicator. The bitstream indicator generator 456 may furthermore in some embodiments determine the number of bits used to encode the stereo or multichannel parameters and pass this information to a mono channel encoder 457.

In some embodiments the controller 454 and the bitstream indicator may operate in a different manner. In some embodiments the encoder is able to generate a variable rate coding mode, for example when using the adaptive entropy encoder and the encoder produces a number of bits which is less than a threshold TCR value and in a fixed rate coding mode (when the variable coding number of bits is larger than the threshold, TCR). In some embodiments the controller may exploit this by implicitly inserting information about whether the frame is all zero or not in the encoded data. This may be performed by the quantizer processor in a manner such as discussed below with respect to FIG. 8.

In some embodiments the quantizer processor/mono encoder 205 further comprises a mono (downmix) channel encoder 457. The mono (downmix) channel encoder 457 may be configured to receive the mono (downmix) channel or parameters. Furthermore the mono (downmix) channel encoder 457 may be configured to receive an indication of the number of bits which have been used in the GR encoder for encoding the current frame. The mono (downmix) channel encoder 457 may then be configured to encode the mono (downmix) channel or parameters based on any suitable encoding method based on the knowledge of the number of bits used by the stereo parameter encoding. The mono channel generator/encoder 457 can encode the generated mono channel audio signal using any suitable encoding format. For example in some embodiments the mono channel audio signal can be encoded using an Enhanced Voice Service (EVS) mono channel encoded form, which may contain a bit stream interoperable version of the Adaptive Multi-Rate-Wide Band (AMR-WB) codec.

With respect to FIG. 8 a summary of the encoding process (such as described in FIG. 4 by steps 505) according to some embodiments and the operation of the quantizer processor/mono encoder 205 shown in FIG. 7 is shown as a flow diagram.

The operation of receiving the stereo parameters is shown in FIG. 8 by step 701.

The scalar quantizer 451 may perform the operation of quantizing the stereo parameters to generate index values or symbols $r\_x$ ($x=0\ldots N$) shown in FIG. 8 by step 703.

The controller may be configured to determine whether the first sub-band parameter is zero or not. In other words to determine whether $r\_0<>0$. Where the controller determines that the first sub-band parameter is not zero then the controller may be configured to control the adaptive mapper and the encoder to operate in an adaptive mode. In other words control the adaptive mapper 453 and GR encoder to encode all the other sub-band parameters according to the methods described in EP2856776. Furthermore the controller may control the bitstream indicator to count the number of bits used (bits_GR).

The operation of controlling the adaptive mapper 453 and GR encoder to encode all the other sub-band parameters according to the methods described in EP2856776 and controlling the bitstream indicator to count the number of bits used (bits_GR) is shown in FIG. 8 by step 704.

Where the controller is configured to determine $r\_0==0$ then the controller is configured to determine whether for all $x\ r\_x==0$. If for all x: $r\_x==0$ then the bitstream indicator can be configured to set bits_GR as the bits used for r_0 else bits_GR is a large number.

The operation of determining if for all $x\ r\_x==0$ then set bits_GR as the bits used for r_0 else set bits_GR as a large number is shown in FIG. 8 by step 705.

The controller may then determine whether the bit_GR value is greater than the fixed rate threshold value. Where this occurs then fixed rate coding may be selected and the adaptive rate code flag or indicator is not set (e.g. flag_GR=0) otherwise the adaptive rate code flag or indicator is set (e.g. flag_GR=1).

The operation of setting (or not setting) the adaptive rate coding flag or indicator is shown in FIG. 8 by step 707.

The encoder may then be configured to apply adaptive rate coding on the parameters where the adaptive rate coding flag is set, but where the first parameter value was a zero value then the coding is stopped at the first parameter. Otherwise fixed rate coding is applied.

The operation of encoding according to the adaptive coding flag value is shown in FIG. 8 by step 709.

Furthermore the operation of receiving the mono parameters is shown in FIG. 8 by step 712.

The operation of encoding the mono parameters/channel based on the Golomb-Rice encoding bit usage is shown in FIG. 8 by step 718.

The operation of outputting flag_GR and encoded parameters is shown in FIG. 8 by step 719.

In such a system an encoded bitstream to be output may be formed first by a bit signaling whether there is fixed rate or variable rate encoding. If there is variable bit rate encoding the first encoded parameter is sent. Furthermore where the encoded parameter is zero then encoding stops for the frame, otherwise adaptive GR encoding continues for the rest of parameters on the frame.

In this example the symbol value which is detected is a zero case. However in some embodiments a similar approach may be applied to any embodiments where the parameter to be encoded has a first occurrence or frequency distribution of symbols within a first wide range of values and which are suitable for entropy encoding and a second occurrence or frequency distribution of symbols with a parameter value outside the first range and which are not suitable for entropy encoding. In such embodiments the controller may be configured to determine whether a first symbol has the parameter value which is outside the first range and whether that occurs for all of the parameters within the frame and control the encoding and output accordingly.

In order to fully show the operations of the codec FIGS. 9 and 10 show a decoder and the operation of the decoder according to some embodiments.

In some embodiments the decoder 108 comprises a mono channel decoder 801. The mono channel decoder 801 is configured in some embodiments to receive the encoded mono channel signal.

Furthermore the mono channel decoder 801 can be configured to decode the encoded mono channel audio signal using the inverse process to the mono channel coder shown in the encoder. In some embodiments the mono channel decoder 801 may be configured to receive an indicator from the stereo channel decoder 803 indicating the number of bits used for the stereo signal to assist the decoding of the mono channel.

In some embodiments the mono channel decoder 801 can be configured to output the mono channel audio signal to the stereo channel generator 809.

In some embodiments the decoder 108 can comprise a stereo channel decoder 803. The stereo channel decoder 803 is configured to receive the encoded stereo parameters.

Furthermore the stereo channel decoder 803 can be configured to decode the stereo channel signal parameters from the entropy code to a symbol value.

The stereo channel decoder 803 is further configured to output the decoded index values to an adaptive symbol reorderer (demapper) 807.

In some embodiments the decoder comprises a bit signalling decoder 804. The bit signalling decoder 804 can be configured to receive the fixed rate variable rate indicator and pass this to the adaptive symbol reorderer 807.

In some embodiments the decoder 108 comprises an adaptive symbol reorderer 807. The adaptive symbol or index reorderer (demapper) in some embodiments is configured to receive the fixed rate/variable rate indicator bit from the bit signalling decoder 804 and the symbols from the stereo channel decoder 803.

The adaptive symbol reorderer 807 can then be configured to determine whether the first sub-band parameter value within a frame is equal to zero. Where the first sub-band parameter value is not zero then the adaptive symbol reorderer may implement adaptive reordering in the same manner as described in EP2856776.

Where the first sub-band parameter value is zero and the fixed rate/variable rate indicator bit from the bit signalling decoder 804 indicates a fixed rate code then the adaptive symbol reorderer may implement adaptive reordering in the same manner as described in EP2856776.

Where the first sub-band parameter value is zero and the fixed rate/variable rate indicator bit from the bit signalling decoder 804 indicates a variable rate code then the adaptive symbol reorderer may duplicate the first sub-band parameter symbol value (e.g. 0) for the whole frame.

Furthermore in some embodiments the symbol reorderer 807 is configured to de-quantize the demapped or re-ordered index value into a parameter using the inverse process to that defined within the quantizer section of the quantizer processor within the encoder.

In some embodiments the decoder comprises a stereo channel generator 809 configured to receive the reordered decoded symbols (the stereo parameters) and the decoded mono channel and regenerate the stereo channels in other words applying the level differences to the mono channel to generate a second channel.

With respect to FIG. 10 a summary of the decoding process according to some embodiments and the operation of the decoder 108 shown in FIG. 9 is shown as a flow diagram.

The operation of receiving the encoded mono channel audio signal is shown in FIG. 10 by step 901.

The operation of receiving the encoded stereo parameters is shown in FIG. 10 by step 902.

The operation of receiving the bitstream indicator (the fixed rate/variable rate) flag or indicator (flag_GR) is shown in FIG. 10 by step 903.

The operation of checking the bitstream indicator (the fixed rate/variable rate) indicator is shown in FIG. 10 by step 904.

Where the fixed rate/variable rate) indicator indicates that the flag_GR value indicates that the bitstream has been adaptively encoded (flag_GR=1) then the decoder is configured to decode the stereo parameters adaptively. Where the first decoded parameter=0 then the decoding stops and all of the parameters can be set to be equal to 0 i.e. for all x: r_x=0.

The operation of adaptively decoding the stereo parameters is shown in FIG. 10 by step 906.

Where the fixed rate/variable rate) indicator indicates that the flag_GR value indicates that the bitstream has been fixed rate encoded (flag_GR=0) then the decoder is configured to decode the stereo parameters using a fixed rate decoding.

The operation of fixed rate decoding the stereo parameters is shown in FIG. 10 by step 907.

The outputting of the stereo parameters to the stereo channel generator is shown in FIG. 10 by step 908.

The operation of decoding the mono channel (based on the number of bits used by the stereo channel) is shown in FIG. 10 by step 909.

The operation of generating the stereo channels from the mono channel stereo parameters is shown in FIG. 10 by step 910.

Although in the examples above the variable/fixed rate indicator is shown where a fixed rate indicator indicates a frame with some non-zero parameters and variable rate indicator indicates a frame with all zero parameters in some embodiments this selection may be reversed such that a fixed rate indicator indicates a frame with all zero parameters and a variable rate indicator indicates a frame with some non-zero parameters.

Although the above examples describe embodiments of the application operating within a codec within an apparatus 10, it would be appreciated that the invention as described below may be implemented as part of any audio (or speech) codec, including any variable rate/adaptive rate audio (or speech) codec. Thus, for example, embodiments of the application may be implemented in an audio codec which may implement audio coding over fixed or wired communication paths.

Thus user equipment may comprise an audio codec such as those described in embodiments of the application above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the application may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the application may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the application may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:

(a) hardware-only circuit implementations (such as implementations in only analog and/or digital circuitry) and (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method comprising:

receiving at least two audio channel signals;

determining, for a first frame, at least two parameters representing a difference between the at least two channel audio signals;

scalar quantising the at least two parameters to generate at least two index values;

adaptively encoding an initial scalar quantized parameter of the at least two parameters;

determining whether the initial scalar quantized parameter has a value different from a predetermined value;

adaptively encoding any unencoded scalar quantized parameters where the initial scalar quantized parameter has a value different from the predetermined value;

determining whether the at least two scalar quantized parameters have values equal to the predetermined value where the initial scalar quantized parameter has a value equal to the predetermined value;

adaptively encoding any unencoded scalar quantized parameters and generating an indicator that an output is one of fixed or variable rate coding where the initial scalar quantized parameter has a value equal to the predetermined value and at least one of the at least two scalar quantized parameters have values different from the predetermined value;

generating an indicator that the output is the other of the one of fixed or variable rate coding where the initial scalar quantized parameter has a value equal to the predetermined value and the at least two scalar quantized parameters have values equal to the predetermined value;

generating a single channel representation of the at least two audio channel signals dependent on the at least two parameters; and encoding the single channel representation.

2. The method as claimed in claim 1, wherein adaptively encoding the initial scalar quantized parameter and adaptively encoding the any unencoded scalar quantized parameters comprises:

determining an initial index map for reordering an index value associated with the scalar quantized parameter, and determining at least one further index map for reordering at least one further index value associated with the any unencoded scalar quantized parameters, wherein the at least one further index map is determined based on the index value associated with the scalar quantized parameter;

reordering the index value associated with the scalar quantized parameter based on the initial index map;
reordering the at least one further index value associated with the any unencoded scalar quantized parameters based on the at least one further index map;
encoding the reordered index value associated with the scalar quantized parameter dependent on an order position of the reordered index value associated with the scalar quantized parameter; and
encoding the at least one further index value associated with the any unencoded scalar quantized parameters based on an order position of the reordered at least one further index value associated with the any unencoded scalar quantized parameters.

3. The method as claimed in claim 1, wherein adaptively encoding the scalar quantized parameters comprises:
determining an occurrence frequency of index values;
reordering the index value dependent on the occurrence frequency of index values to generate a reordered index value; and
encoding the reordered index value dependent on an order position of the reordered index value.

4. A method comprising:
decoding from a first part of a signal at least one parameter index value, wherein the parameter index value represents a difference between at least two channel audio signals, and from a second part of the signal a fixed rate/variable rate indicator and wherein the signal is an encoded multichannel audio signal;
reordering a first of the at least one parameter index value based on a first determined reordering to generate a first reordered index value;
determining whether a parameter value associated with the first reordered index is different from a predetermined value;
adaptively reordering any further of the at least one parameter index values where the parameter value associated with the first reordered index is different to the predetermined value;
determining whether the fixed rate/variable rate indicator is a determined one of a fixed rate/variable rate value;
adaptively reordering any further of the at least one parameter index value where the parameter value associated with the first reordered index is equal to the predetermined value and the fixed rate/variable rate indicator is the determined one of a fixed rate/variable rate value; and
duplicating the at least one parameter index value for a frame where the parameter value associated with the first reordered index is equal to the predetermined value and the fixed rate/variable rate indicator is other than the determined one of a fixed rate/variable rate value.

5. The method as claimed in claim 4, wherein reordering the first of the at least one parameter index value based on a first determined reordering to generate a first reordered index value comprises reordering a first parameter index value based on a first determined reordering to generate a first reordered index value, and adaptively reordering any further of the at least one parameter index values comprises reordering any further index values based on a second determined reordering to generate a second reordered index value, wherein the second determined reordering is based on the first reordered index value.

6. An apparatus comprising:
a parameter determiner configured to determine, for a first frame, at least two parameters representing a difference between the at least two channel audio signals;
a scalar quantiser configured to scalar quantile the at least two parameters to generate at least two index values;
a parameter encoder configured to adaptively encode an initial scalar quantiser parameter of the at least two parameters;
a bitstream indicator configured to generate an indicator that an output bitstream is one or other of fixed or variable rate coding;
a encoder controller configured to determine whether the initial scalar quantiser parameter has a value different from a predetermined value, and configured to control the parameter encoder to adaptively encode any unencoded scalar quantized parameters where the initial scalar quantized parameter has a different from the predetermined value, and wherein
the encoder controller is further configured to determine whether the at least two scalar quantized parameters have values equal to the predetermined value where the initial scalar quantized parameter has a value equal to the predetermined value, the encoder controller further configured to:
control the parameter encoder to adaptively encode any unencoded scalar quantized parameters and control the bitstream indicator to generate the indicator that the output bitstream is one of fixed or variable rate coding where the initial scalar quantized parameter has a value equal to the predetermined value and at least one of the at least two scalar quantized parameters have values different from the predetermined value;
control the bitstream indicator to generate an indicator that the output is the other of the one of fixed or variable rate coding where the initial scalar quantized parameter has a value equal to the predetermined value and the at least two scalar quantized parameters have values equal to the predetermined value;
a mono channel generator configured to generate a single channel representation of the at least two audio channel signals dependent on the at least two parameters; and
a mono channel encoder configured to encode the single channel representation.

7. The apparatus as claimed in claim 6, wherein the parameter encoder is configured to:
determine an initial index map for reordering an index value associated with the scalar quantized parameter, and determining at least one further index map for reordering at least one further index value associated with the any unencoded scalar quantized parameters, wherein the at least one further index map is determined based on the index value associated with the scalar quantized parameter;
reorder the index value associated with the scalar quantized parameter based on the initial index map;
reorder the at least one further index value associated with the any unencoded scalar quantized parameters based on the at least one further index map;
encode the reordered index value associated with the scalar quantized parameter dependent on an order position of the reordered index value associated with the scalar quantized parameter; and
encode the at least one further index value associated with the any unencoded scalar quantized parameters based on an order position of the reordered at least one further index value associated with the any unencoded scalar quantized parameters.

8. The apparatus as claimed in claim 6, wherein the parameter encoder is configured to:
determine an occurrence frequency of index values;

reorder the index value dependent on the occurrence frequency of index values to generate a reordered index value; and encode the reordered index value dependent on an order position of the reordered index value.

9. The apparatus as claimed in claim 7, wherein the parameter encoder is configured to apply a Golomb-Rice encoding to the reordered index value dependent on an order position of the reordered index value.

10. The apparatus as claimed in claim 6, wherein the scalar quantiser is configured to order the scalar quantized output according to a predetermined map.

11. The apparatus as claimed in claim 6, wherein the one of fixed or variable rate coding is the fixed rate coding and the other of fixed or variable rate coding is variable rate coding.

12. The apparatus as claimed in claim 6, wherein the mono channel encoder is configured to:
determine a number of bits used for encoding the at least two scalar quantized parameters; and
encode the single channel representation based on the determined number of bits.

13. An apparatus for decoding comprising:
a parameter decoder configured to decode from a first part of a signal at least one parameter index value, wherein the parameter index value represents a difference between at least two channel audio signals; and wherein the signal is an encoded multichannel audio signal
an indicator decoder configured to decode from a second part of the signal a fixed rate/variable rate indicator;
a parameter reorderer configured to reorder a first of the at least one parameter index value based on a first determined reordering to generate a first reordered index value;
a parameter determiner configured to determine whether a parameter value associated with the first reordered index is different from a predetermined value;
the parameter determiner is further configured to adaptively reordering any further of the at least one parameter index values where the parameter value associated with the first reordered index is different to the predetermined value;
the parameter determiner further configured to determine whether the fixed rate/variable rate indicator is a determined one of a fixed rate/variable rate value;

the parameter reorderer configured to adaptively reorder any further of the at least one parameter index value where the parameter value associated with the first reordered index is equal to the predetermined value and the fixed rate/variable rate indicator is the determined one of a fixed rate/variable rate value, and duplicate the at least one parameter index value for a frame where the parameter value associated with the first reordered index is equal to the predetermined value and the fixed rate/variable rate indicator is other than the determined one of a fixed rate/variable rate value.

14. The apparatus as claimed in claim 13, wherein the parameter reorderer is configured to reorder the first parameter index value based on a first determined reordering to generate a first reordered index value and reorder any further index values based on a second determined reordering to generate a second reordered index value, wherein the second determined reordering is based on the first reordered index value.

15. The apparatus as claimed in claim 13, wherein the parameter reorderer configured to adaptively reorder any further of the at least one parameter index values is configured to:
determine an occurrence frequency of index values;
reorder the index value to generate a reordered index value, wherein the reordering is dependent on the occurrence frequency of reordered index values.

16. The apparatus as claimed in claim 13, wherein the parameter reorderer is further configured to dequantize the reordered index values to generate the parameter.

17. The apparatus as claimed in claim 13, wherein the parameter decoder is configured to decode the first part of a signal using a Golomb-Rice decoding.

18. The apparatus as claimed in claim 13, wherein the determined one of a fixed rate/variable rate value is a fixed rate coding indicator value.

19. The apparatus as claimed in claim 13, further comprising a further decoder configured to:
receive from a further part of a signal an encoded downmix channel signal;
determine a number of bits used in the first part of the signal; and
decode the encoded downmix channel signal based on the number of bits used in the first part of the signal.

20. The apparatus as claimed in claim 13, wherein the predetermined value is zero.

* * * * *